US008493712B2

(12) United States Patent
Kaneda et al.

(10) Patent No.: US 8,493,712 B2
(45) Date of Patent: Jul. 23, 2013

(54) SOLID ELECTROLYTIC CAPACITOR AND METHOD OF MANUFACTURING THE SAME

(75) Inventors: Kazuhiro Kaneda, Fukaya (JP); Koichi Nishimura, Kadoma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 251 days.

(21) Appl. No.: 12/719,378

(22) Filed: Mar. 8, 2010

(65) Prior Publication Data

US 2010/0232091 A1    Sep. 16, 2010

(30) Foreign Application Priority Data

Mar. 12, 2009   (JP) ................................. 2009-059489

(51) Int. Cl.
*H01G 9/00*   (2006.01)
(52) U.S. Cl.
USPC ........... 361/523; 361/516; 361/519; 361/525; 361/528; 361/529
(58) Field of Classification Search
USPC ......... 361/516–519, 523–525, 530, 540–541, 361/528–529; 29/25.01, 25.03
See application file for complete search history.

(56) References Cited

U.S. PATENT DOCUMENTS

| 5,005,107 A * | 4/1991 | Kobashi et al. ............... 361/540 |
| 7,086,918 B2 * | 8/2006 | Hsiao et al. ..................... 445/24 |
| 7,429,406 B2 | 9/2008 | Park et al. |
| 7,599,169 B2 * | 10/2009 | Takatani et al. ............... 361/523 |
| 7,760,490 B2 * | 7/2010 | Takatani et al. ............... 361/532 |
| 2003/0124252 A1 | 7/2003 | Park et al. |
| 2004/0190224 A1 | 9/2004 | Takatani et al. |
| 2005/0118335 A1 | 6/2005 | Park et al. |

FOREIGN PATENT DOCUMENTS

| JP | 63-158829 A | 7/1988 |
| JP | 2003-286570 A | 10/2003 |
| JP | 2004-146615 A | 5/2004 |
| JP | 2004-319971 A | 11/2004 |

* cited by examiner

*Primary Examiner* — Nguyen T Ha
(74) *Attorney, Agent, or Firm* — Marvin A. Motsenbocker; Mots Law, PLLC (57) ABSTRACT

Provided are a solid electrolytic capacitor capable of reducing leakage current and a method of manufacturing the same. An aspect of the invention provides a solid electrolytic capacitor that comprises: an anode including any one of niobium and a niobium alloy; a dielectric layer formed on the anode; a cathode layer formed on the dielectric layer, the cathode layer having a work function of 5 eV or larger; and a cathode lead layer formed on the cathode layer.

10 Claims, 4 Drawing Sheets

SOLID ELECTROLYTIC CAPACITOR AND METHOD OF MANUFACTURING THE SAME

CROSS REFERENCE TO RELATED APPLICATIONS

This application claims the benefit of priority under 35 U.S.C. §119 to the prior Japanese Patent Application No. P2009-059489 entitled "SOLID ELECTROLYTIC CAPACITOR AND METHOD OF MANUFACTURING THE SAME," filed on Mar. 12, 2009, the entire contents of which are incorporated herein by reference.

BACKGROUND OF THE INVENTION

1. Field of the Invention

The invention relates to a solid electrolytic capacitor using niobium or a niobium alloy for an anode, and a method of manufacturing the same.

2. Description of Related Art

Along with recent miniaturization of electronic equipment such as personal computers, solid electrolytic capacitors to be used for such electronic equipment are also desired to be small and have high capacity. In view of such desire, solid electrolytic capacitors are under development that use, for a dielectric layer, niobium oxide formed by anodizing an anode made of niobium (called a niobium solid electrolytic capacitor, below), instead of tantalum oxide formed by anodizing an anode made of tantalum. This is because niobium oxide has a dielectric constant that is approximately 1.8 times larger than that of tantalum oxide, and hence the niobium solid electrolytic capacitor can achieve an increase in capacity compared with that with the aforementioned solid electrolytic capacitor using tantalum oxide (called a tantalum solid electrolytic capacitor, below). Accordingly, the niobium solid electrolytic capacitor has an advantage that it can be smaller in size than the tantalum solid electrolytic capacitor in the case of obtaining comparable capacities, and is therefore expected to serve as a next-generation solid electrolytic capacitor.

However, niobium solid electrolytic capacitors under development have a problem regarding equivalent series resistance (called ESR, below) and leakage current. For practical use of such niobium solid electrolytic capacitors, further reduction in ESR and leakage current is desired.

To reduce ESR of a solid electrolytic capacitor, a technique has been disclosed in which, instead of conductive polymers used as a cathode, a metal layer including silver, platinum or gold is directly formed on a surface of a dielectric layer made of a metal oxide film formed by anodizing an anode made of valve metal particles (see, for example, Japanese Patent Application Publication No. 2004-319971 (called Patent Document 1, below)).

However, the technique described in Patent Document 1 is aimed to reduce ESR, and not to reduce leakage current. For this reason, it is confirmed that the solid electrolytic capacitor described in Patent Document 1, using niobium oxide as the dielectric and platinum as the cathode, for example, cannot sufficiently reduce leakage current.

SUMMARY OF THE INVENTION

Through a keen examination on occurrence of leakage current in solid electrolytic capacitors, the inventors have found out that a barrier against electrons exists at an interface between a cathode and a dielectric layer. The barrier is defined by a value obtained by subtracting the value of electron affinity of the dielectric layer from the work function value of a material of the cathode, and the height of the barrier affects the leakage current. On the basis of these findings, it is found that the solid electrolytic capacitor described in Patent Document 1 cannot sufficiently reduce leakage current since the height of the barrier formed at the interface between the cathode made of a metal layer and the dielectric layer is low.

An aspect of the invention provides a solid electrolytic capacitor that comprises: an anode including any one of niobium and a niobium alloy; a dielectric layer formed on the anode; a cathode layer formed on the dielectric layer, the cathode layer having a work function of 5 eV or larger; and a cathode lead layer formed on the cathode layer.

Another aspect of the invention provides a solid electrolytic capacitor that comprises: an anode including any one of niobium and a niobium alloy; a dielectric layer formed on the anode; a cathode layer formed on the dielectric layer, the cathode layer including anyone of iridium and iridium oxide; and a cathode lead layer formed on the cathode layer.

Still another aspect of the invention provides a method of manufacturing a solid electrolytic capacitor that comprises: forming an anode including any one of niobium and a niobium alloy; forming a dielectric layer by anodization to cover at least a part of the anode with the dielectric layer; forming a cathode layer made of any one of a metal and an electrically-conductive metal compound having a work function of 5 eV or larger, to cover at least a part of the dielectric layer with the cathode layer; and forming a cathode lead layer to cover at least a part of the cathode layer with the cathode lead layer.

DETAILED DESCRIPTION OF EMBODIMENTS

Next, embodiments of the invention are described with reference to the drawings. In the following description of the drawings, the same or similar numerals are attached to the same or similar elements. It should be noted that the drawings are schematic and ratios of dimensions and the like may be different from actual ones. Therefore, specific dimensions and the like should be determined in consideration of the following description. Needless to say, the drawings also include portions having different dimensional relationships and ratios from each other.

Prepositions, such as "on", "over" and "above" may be defined with respect to a surface, for example a layer surface, regardless of that surface's orientation in space. Preposition "above" may be used in the specification and claims even if a layer is in contact with other layers. Preposition "on" may be used in the specification and claims when a layer is not in contact with other layers, for example, there is an intervening layer between them.

First Embodiment

Figure 1:
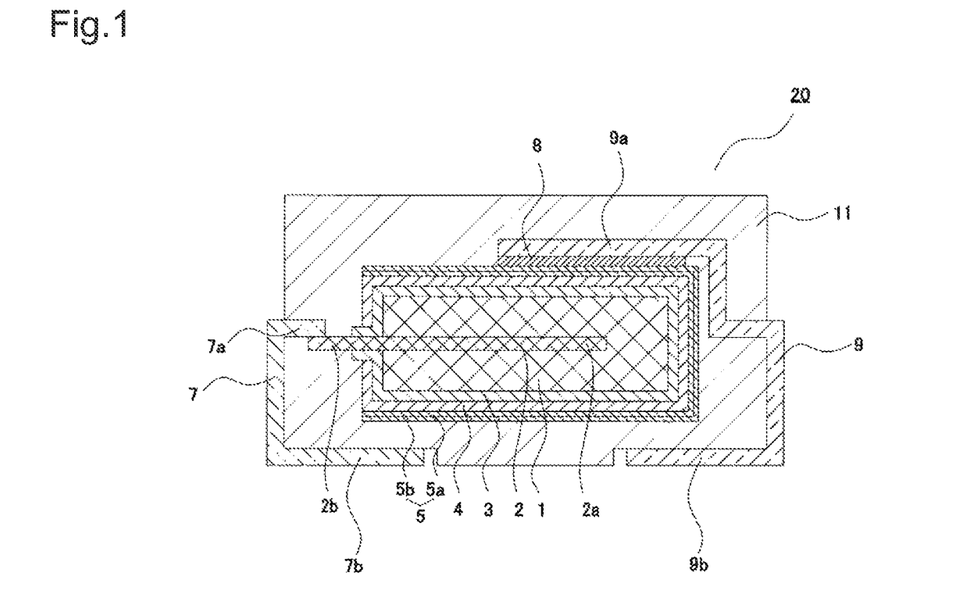
FIG. 1 is a cross-sectional view for describing a niobium solid electrolytic capacitor according to a first embodiment.

FIG. 1 is a schematic cross-sectional view for describing the inside of a niobium solid electrolytic capacitor according to this embodiment. Niobium solid electrolytic capacitor 20 according to this embodiment has an outer shape of a rectangular parallelepiped, and includes anode 1, anode lead 2, dielectric layer 3, cathode layer 4 and cathode lead layer 5, as shown in FIG. 1. Anode lead 2 is provided so that end portion 2a is embedded in anode 1 while other end portion 2b protrudes from anode 1. Dielectric layer 3 is formed by anodizing anode 1 so that dielectric layer 3 covers at least part of anode 1. Cathode layer 4 at least partially covers dielectric layer 3. Cathode lead layer 5 at least partially covers cathode layer 4. Anode terminal 7 is connected to other end portion 2b of anode lead 2, and cathode terminal 9 is bonded to cathode lead layer 5 with a conductive adhesive 8. Moreover, outer resin package 11 is formed to expose part of each of anode terminal 7 and cathode terminal 9.

A concrete configuration of niobium solid electrolytic capacitor 20 according to this embodiment is described below. Anode 1 is formed of a porous sintered body formed by: molding metal particles made of niobium, which is a valve metal; and then sintering the molded metal particles. In anode 1, end portion 2a of anode lead 2 made of niobium is embedded. Thereby, anode 1 is integrated with anode lead 2. In this embodiment, anode 1 has an outer shape of a rectangular parallelepiped. Anode lead 2 may be made of a niobium metal or a valve metal different from niobium. Although a niobium (Nb) metal is used as a valve metal forming anode 1, a niobium alloy may be used, instead. As the niobium alloy, a general niobium alloy mainly containing niobium can be used, and a niobium alloy containing an additive having a weight of 20% or less of the total weight of the niobium alloy is preferably used. Examples of the additive contained in the niobium alloy are silicon, vanadium, boron, nitrogen, aluminum, titanium, tantalum, tungsten, molybdenum, hafnium and the like. The niobium alloy is made by adding such an additive to niobium.

Dielectric layer 3 can be formed to cover anode 1, by anodizing anode 1. FIG. 1 shows dielectric layer 3 made of niobium oxide and formed on an outer surface of anode 1. Since anode 1 is a porous body as described above, dielectric layer 3 is formed also on a wall surface of each pore of the porous body.

Figure 2:
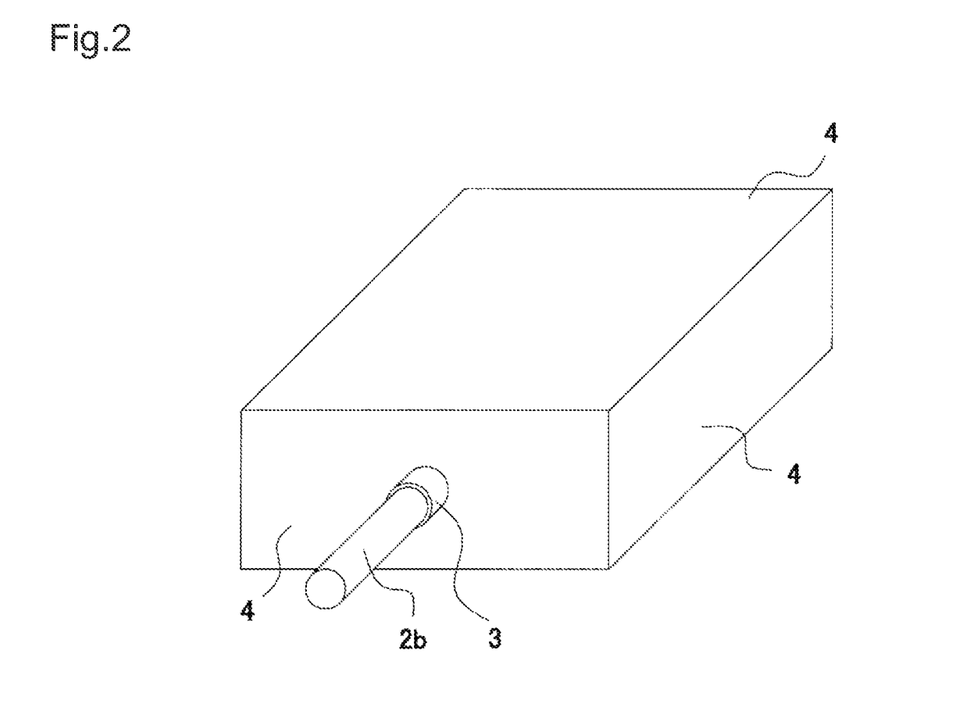
FIG. 2 is a perspective view for describing arrangement of a cathode layer of the niobium solid electrolytic capacitor according to the first embodiment.

Cathode layer 4 is formed to cover dielectric layer 3. FIG. 2 is a perspective view showing a state in which cathode layer 4 is formed on dielectric layer 3 formed on the surface of anode 1. In this embodiment, cathode layer 4 covers a substantially entire surface of dielectric layer 3 formed on the surface of anode 1 having a rectangular parallelepiped shape.

As cathode layer 4, a metal or an electrically-conductive metal compound having a work function of 5 eV or larger is used. Concrete examples of the metal used as a material of cathode layer 4 having a work function of 5 eV or larger are iridium, palladium, rhodium, rhenium, cobalt and nickel, for example. Examples of the electrically-conductive metal compound are metal oxides such as iridium oxide, palladium oxide, rhodium oxide and rhenium oxide, for example. The electrically-conductive material has an electrical conductivity sufficient to serve as an electrode, and the value range of such an electrical conductivity is approximately $10^4$ to $10^6$ S/cm.

Alternatively, a metal nitride such as cobalt nitride or nickel nitride, for example, can also be used as the metal compound, instead of the above-given metal oxides. Although FIG. 1 shows a state in which cathode layer 4 is formed on dielectric layer 3 formed on the outer surface of anode 1, cathode layer 4 may also be formed on a surface of dielectric layer 3 formed on the wall surface of each pore of the porous body.

Cathode lead layer 5 is formed to cover part of cathode layer 4, and has a laminated structure in which carbon layer 5a and silver paste layer 5b are formed in this order. Carbon layer 5a is a layer containing carbon particles. With such a structure, cathode lead layer 5 is formed to be in direct contact with cathode layer 4.

Cathode terminal 9 is attached to cathode lead layer 5. Specifically, cathode terminal 9 is formed by bending a strip of metal plate, and a bottom surface of one end portion 9a of cathode terminal 9 is bonded to cathode lead layer 5 with conductive adhesive 8 as shown in FIG. 1. Thereby, cathode terminal 9 and cathode lead layer 5 are mechanically as well as electrically connected to each other. Concrete examples of a material of the conductive adhesive 8 are a silver paste containing a mixture of silver and epoxy resin, and the like.

Here, cathode lead layer 5 may be formed of anyone of carbon layer 5a and silver paste layer 5b, and can have various structures as long as cathode layer 4 and cathode terminal 9 are electrically connected. Moreover, only cathode lead layer 5 may be formed between cathode layer 4 and cathode terminal 9. In this case, cathode layer 4 and cathode terminal 9 are mechanically as well as electrically connected via cathode lead layer 5.

Anode terminal 7 is attached to anode lead 2. Specifically, anode terminal 7 is formed by bending a slip of metal plate, and a bottom surface of one end portion 7a of anode terminal 7 is mechanically as well as electrically connected to other end portion 2b of anode lead 2 by welding or the like as shown in FIG. 1. Examples of a material of anode terminal 7 and cathode terminal 9 are copper, a copper alloy, an iron-nickel alloy (42 alloy) and the like.

Outer resin package 11 is formed to cover the exposed portions of cathode layer 4, anode terminal 7 and cathode terminal 9 provided as described above. Different end portion 7b of anode terminal 7 and different end portion 9b of cathode terminal 9 are exposed from side surfaces and a bottom surface of outer resin package 11, and the exposed portions are used for soldering to a substrate. As a material of outer resin package 11, a material which functions as a sealing material is used, and concrete examples of such a material are epoxy resin, silicone resin and the like. Outer resin package 11 can be formed by hardening a resin conditioned by appropriately combining a base resin, a hardener and filler particles.

(Method of Manufacturing Niobium Solid Electrolytic Capacitor According to First Embodiment)

Description is given below of a method of manufacturing the niobium solid electrolytic capacitor according to this embodiment. FIG. 3 provides views showing steps for manufacturing the niobium solid electrolytic capacitor according to this embodiment.

<Step 1: Formation of Anode>

Figure 3A:
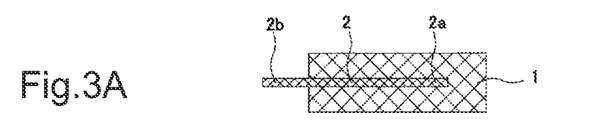
FIGS. 3A to 3F are views for describing steps for manufacturing the niobium solid electrolytic capacitor according to the first embodiment.

As shown in FIG. 3A, anode 1 is formed by: molding anode 1 by using powder of a valve metal, i.e., a niobium metal having a primary particle size of approximately 0.5 μm, in a state where end portion 2a of anode lead 2 is embedded in anode 1; and then sintering anode 1 thus molded, in a vacuum. Different end portion 2b of anode lead 2 is fixed in the state of protruding from one surface of anode 1. The outer shape of anode 1, which is a porous sintered body thus formed, is a rectangular parallelepiped having a length of 4.4 mm, a width of 3.3 mm and a thickness of 1.0 mm, for example.

<Step 2: Formation of Dielectric Layer>

Figure 3B:
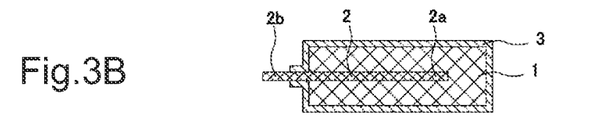

As shown in FIG. 3B, dielectric layer 3 including an oxide film is formed on surfaces of anode 1 by anodizing anode 1. Specifically, anode 1 is anodized at a constant voltage of approximately 10 V in a phosphoric acid solution for approximately two hours, and thereby dielectric layer 3 made of niobium oxide is formed.

<Step 3: Formation of Cathode Layer>

Figure 3C:
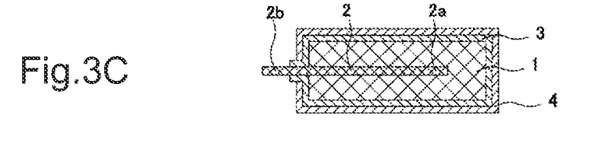

As shown in FIG. 3C, cathode layer 4 is formed on a surface of dielectric layer 3 by a plating method. Here, cathode layer 4 is formed of a metal or an electrically-conductive metal compound having a work function of 5 eV or larger. Specifically, firstly, anode 1 on which dielectric layer 3 is formed is soaked in a plating solution made by dissolving iridium chloride in a phosphoric acid solution. While anode 1 is being soaked, anode lead 2 is fixed so that other end portion 2b of anode lead 2 is not soaked in the plating solution. Then, electrodes are connected respectively to other end portion 2b of anode lead 2 and a counter electrode made of platinum and soaked in the plating solution, and a predetermined voltage is applied to the electrodes. Through this electroplating, cathode layer 4 is formed on dielectric layer 3. Cathode layer 4 thus formed has, for example, a thickness of approximately 1 μm at the surface of the porous sintered body of anode 1, and of submicrons at the inside of anode 1. However, the thickness is not limited to this, and may be of any value between 1 μm and 5 mm both inclusive at the surface of the porous sintered body of anode 1. In particular, for the purpose of the durability, the thickness at the surface of the porous sintered body of anode 1 is preferably between 0.5 μm and 1 μm both inclusive. The thickness at the inside of anode 1 is preferably between 10 nm and 5 μm both inclusive. In particular, for the purpose of the reduction of ESR, the thickness at the inside of anode 1 is preferably between 20 nm and 1 μm both inclusive.

Examples of a method for forming cathode layer 4, other than a plating method, are a sputtering method, a vapor deposition method and the like. In the case of employing a sputtering method or a vapor deposition method, cathode layer 4 can be formed on the surface of dielectric layer 3 by rotating the element on which dielectric layer 3 is formed as described above. When anode 1 is a porous body as in this embodiment, formation of cathode layer 4 by a plating method facilitates covering, with cathode layer 4, dielectric layer 3 formed on the surface of each pore of anode 1, which is a porous body. Moreover, since cathode layer 4 is formed by soaking anode 1 in a plating solution in a plating method, cathode layer 4 to cover the substantially entire surface of dielectric layer 3 is formed at once.

<Step 4: Formation of Cathode Lead Layer>

Figure 3D:
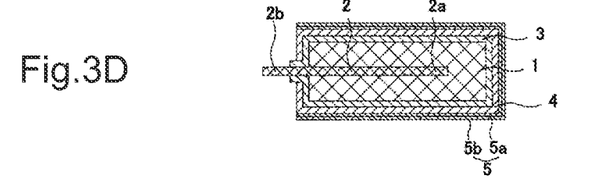

As shown in FIG. 3D, carbon layer 5a is formed by applying a carbon paste to a surface of cathode layer 4 to be in direct contact with the surface, and then silver paste layer 5b is formed by applying a silver paste on carbon layer 5a. In this embodiment, cathode lead layer 5 is formed of carbon layer 5a and silver paste layer 5b thus formed.

<Step 5: Connections of Anode Terminal and Cathode Terminal>

Figure 3E:
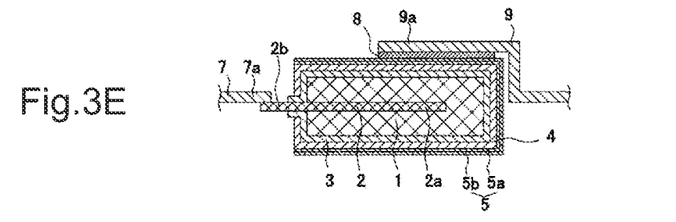

As shown in FIG. 3E, end portion 7a of anode terminal 7 is electrically and mechanically connected to end portion 2b of anode lead 2 by welding or the like. In addition, end portion 9a of cathode terminal 9 is electrically and mechanically connected to cathode lead layer 5 with the conductive adhesive 8.

<Step 6: Molding Step>

Figure 3F:
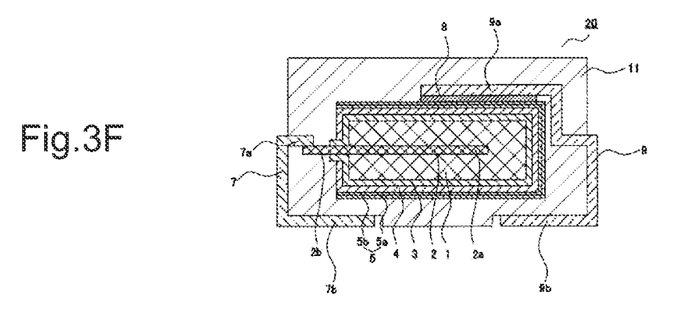

As shown in FIG. 3F, after the formation in Step 5, outer resin package 11 is formed by a transfer molding method using a sealing material containing epoxy resin and an imidazole compound, so as to expose part of each of anode terminal 7 and cathode terminal 9. Specifically, the sealing material which is preheated is injected into a mold, and is then hardened in the mold. After the formation of outer resin package 11, the exposed portions of anode terminal 7 and cathode terminal 9 are each bent along the corresponding side surface and the bottom surface of outer resin package 11. Thereby, terminal end portions 7b and 9b to be used for soldering to the substrate are formed.

(Operations and Effects)

In the niobium solid electrolytic capacitor according to this embodiment, the cathode layer made of a metal or an electrically-conductive metal compound having a work function of 5 eV or larger is formed on the dielectric layer made of niobium oxide. With this configuration, the height of the barrier formed at an interface between the cathode layer, functioning as a cathode, and the dielectric layer made of niobium oxide can be increased. Consequently, the niobium solid electrolytic capacitor according to this embodiment can reduce leakage current.

Figure 4A:
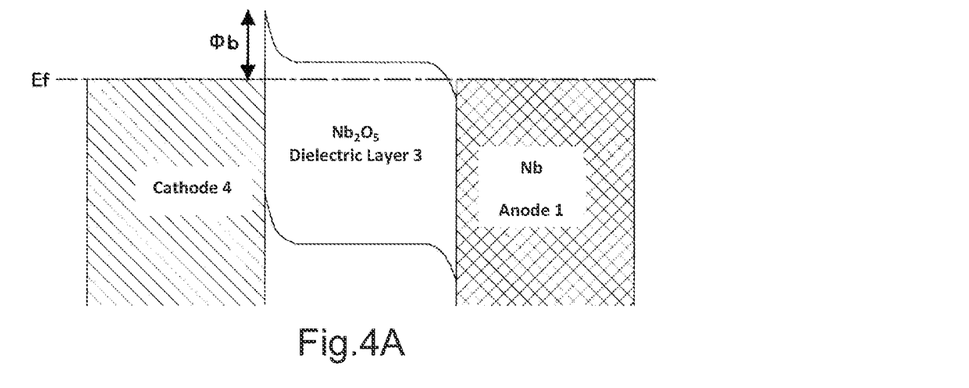
FIGS. 4A and 4B are each a view of an energy band formed in an anode, a dielectric layer and a cathode layer.
Figure 4B:
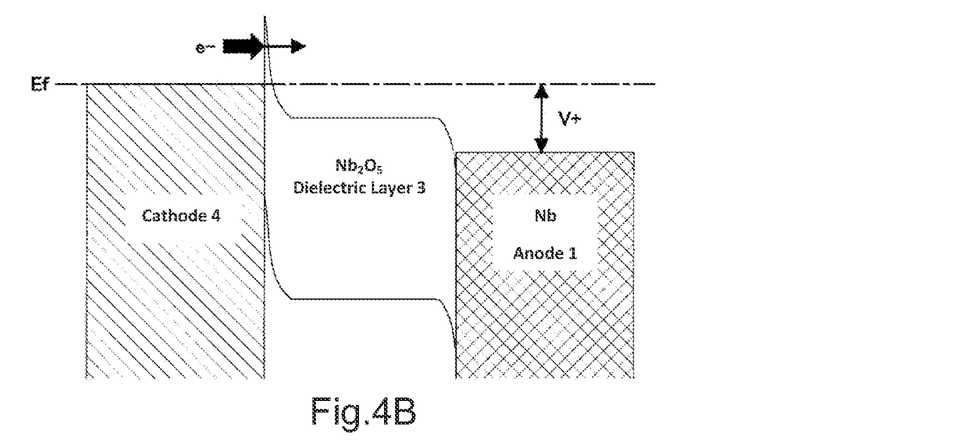

How the leakage current can be reduced is described below. FIG. 4A is a view of an energy band in a state where anode 1, dielectric layer 3 and cathode 4 are connected (applied voltage=0V). FIG. 4B is a view of an energy band in the case of applying a positive voltage to the anode side in the state where anode 1, dielectric layer 3 and cathode layer 4 are connected.

A height $f_b$ of a barrier formed at the interface between cathode layer 4 and dielectric layer 3 shown in FIG. 4A is a value obtained by subtracting the value of an electron affinity $\chi_s$ of dielectric layer 3 from a work function $f_m$ of cathode layer 4 as shown below as Expression (1). Here, the work function $f_m$ is defined by the difference in energy between a vacuum level and a Fermi level, and the electron affinity $\chi_s$ of the dielectric is defined by the difference in energy between the bottom of a conduction band and the vacuum level.

$$f_b = f_m - \chi_s \quad (1)$$

The electron affinity $\chi_s$ is a value obtained by subtracting the value of a band gap $E_g$ from an ionization potential $I_p$ of dielectric layer 3 as shown below as Expression (2), and can thus be obtained from the ionization potential $I_p$ and the band gap $E_g$.

$$\chi_s = I_p - E_g \quad (2)$$

The work function $f_m$ can be measured by using a photoelectron spectroscopy (e.g., AC-2 manufactured by RIKEN KEIKI Co., Ltd.). The ionization potential $I_p$ can be measured by using an ionization potential measuring apparatus (e.g., PYS-201 manufactured by IPROS Corporation). The band gap $E_g$ can be measured by using Film Tek 3000 manufactured by Scientific Computing International, for example.

As a result of measurements using such apparatuses, the work function $f_m$ of anode 1 made of niobium is 4.27 eV (expressed in three significant figures). In addition, the ionization potential $I_p$ and the band gap $E_g$ of dielectric layer 3 made of niobium oxide ($Nb_2O_5$) are 7.80 eV, and 3.33 eV, respectively. Accordingly, the electron affinity $\chi_s$ is 4.47 eV.

As described above, the height $f_b$ of the barrier is the difference between the work function $f_m$ of cathode layer 4 and the electron affinity $\chi_s$ of dielectric layer 3. Since the electron affinity $\chi_s$ of dielectric layer 3 made of niobium oxide ($Nb_2O_5$) is 4.47 eV, the height $f_b$ of the barrier can be increased by setting the work function $f_m$ of cathode layer 4 to be 5 eV or larger.

A positive voltage is applied to anode 1 of the solid electrolytic capacitor in an actual operation, and an energy band state as shown in FIG. 4B is considered to be obtained. As understood from FIG. 4B, when the barrier $f_b$ is formed at the interface between dielectric layer 3 and cathode layer 4, it is possible to prevent electrons from flowing from cathode layer 4 to anode 1 under application of a positive voltage to anode 1. Accordingly, by setting the work function $f_m$ of cathode layer 4 to be 5 eV or larger, the height $f_b$ of the barrier can be increased, and leakage current can be further reduced in an actual operating state.

Cathode layer 4 according to this embodiment is made of a metal or an electrically-conductive metal compound. Such a metal and a metal compound are inorganic materials, and can hence prevent a decrease in conductivity of cathode layer 4, a decrease in adhesiveness between dielectric layer 3 and cathode layer 4 and the like attributable to deterioration of the film quality of cathode layer 4 at a high temperature, and can thereby suppress an increase in ESR, compared with the case of using, for cathode layer 4, an organic material such as conducting polymers. Thus, compared with the case of using an organic material such as conducting polymers, cathode layer 4 according to this embodiment can reduce an increase in ESR and can thereby increase reliability of the niobium solid electrolytic capacitor at a high temperature.

Moreover, since such a metal and a metal compound generally have higher conductivities than an organic material such as conducting polymers does, the conductivity of cathode layer 4 can be increased, leading to a reduction in ESR.

Furthermore, in the embodiment, cathode lead layer 5 is formed directly on cathode layer 4. Thereby, compared with the case of using conducting polymers, cathode layer 4 using such a metal or a metal compound can increase the conductivity and reliability as described above, and can hence reduce the ESR between cathode layer 4 and cathode lead layer 5.

Note that, in this embodiment, a material of the sintered body forming anode 1 is not limited to pure niobium, and may instead be a niobium alloy of niobium and a different metal material. The niobium alloy of this case may be arbitrarily composed as long as an energy band structure of the oxide of the niobium alloy is in a range substantially equal to the energy band structure of the oxide of niobium. Here, the substantially-equal range indicates a range in which a barrier high enough to reduce the leakage current as described above can be obtained.

Second Embodiment

Next, a second embodiment is described below. In the following, similar descriptions as those in the first embodiment are omitted. In the second embodiment, a foil made of niobium is used for anode 1, instead of a porous sintered body made of niobium used in the first embodiment. Note that, in this embodiment as well, a material of the foil forming anode 1 is not limited to pure niobium, and may be a niobium alloy of niobium and a different metal material, as in the first embodiment.

Figure 5:
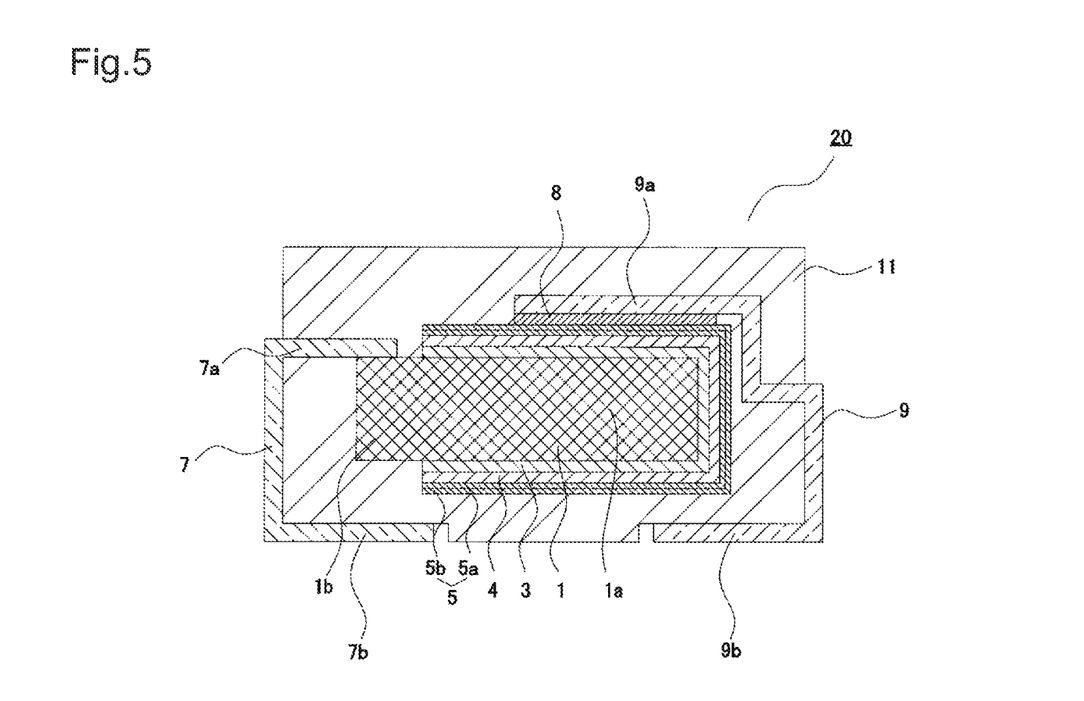
FIG. 5 is a cross-sectional view for describing a niobium solid electrolytic capacitor according to a second embodiment.

FIG. 5 is a schematic cross-sectional view for describing an inside of niobium solid electrolytic capacitor 20 according to this embodiment. A portion, on the side of one end portion 1a, of anode 1 formed of a foil made of niobium or a niobium alloy is anodized, and thereby dielectric layer 3 is formed. To a top surface, on the side of different end portion 1b, of anode 1, end portion 7a of anode terminal 7 is connected. Thus, an anode lead is not required in the case of using a niobium foil for anode 1.

Moreover, in the case of using a foil made of niobium or a niobium alloy, cathode layer 4 can be formed uniformly on dielectric layer 3 with a sputtering method or a vapor deposition method by appropriately rotating anode 1.

(Evaluation)

Figure 6:
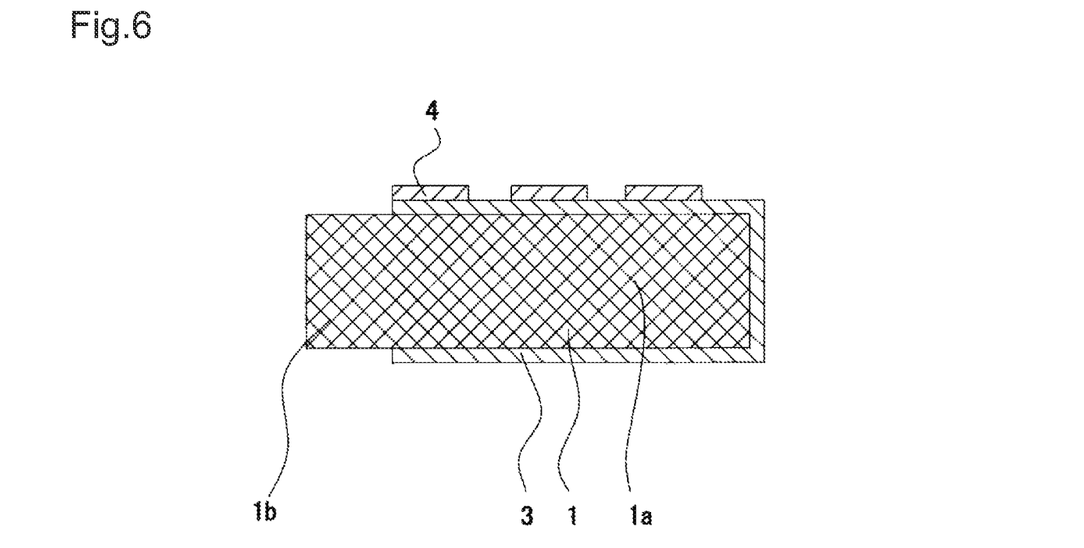
FIG. 6 is a cross-sectional view for describing a niobium solid electrolytic capacitor according to an evaluation sample.

A niobium solid electrolytic capacitor according to each of evaluation samples is manufactured in the following steps, in order to measure leakage current. FIG. 6 is a cross-sectional view schematically showing the solid electrolytic capacitors according to any of the evaluation samples. As shown in FIG. 6, the evaluation sample includes anode 1, dielectric layer 3 and cathode layer 4, which constitute the basic configuration of the solid electrolytic capacitor according to each of the above-described embodiments. An evaluation sample having such a structure in which anode 1, dielectric layer 3 and cathode layer 4 is formed in this order, can serve as a capacitor. In addition, with such an evaluation sample, a leakage current occurring between anode 1 and cathode 4 of the niobium solid electrolytic capacitor according to the embodiment can be recognized and evaluated.

(Evaluation Sample 1)

Through the following steps, a niobium solid electrolytic capacitor according to Evaluation Sample 1 is manufactured to measure leakage current. As anode 1, used is a niobium foil of 99.9% purity formed by rolling to be 20 mm long, 40 mm wide and 1 mm thick. Surfaces of one end portion 1a of anode 1 are anodized in a phosphoric acid solution of 0.5 wt % at a constant voltage of approximately 80 V and a limiting current of 10 mA/400 $mm^2$ for approximately four hours. By this anodization, the dielectric layer 3 made of niobium oxide is formed. The film thickness of the niobium oxidation thus formed is 220 nm according to a cross-section observation using a transmission electron microscope.

Then, by an RF sputtering method, cathode layers made of iridium oxide are formed on some parts of a surface of the niobium foil by using a stainless sheet mask including holes formed therein at a pitch of 5 mm, the holes each having a diameter of 1.5 mm. The sputtering is performed by using iridium of 99.9% purity as a target under the sputtering conditions in which the total pressure is 10 mTorr (Ar partial pressure: 5 mTorr, $O_2$ partial pressure: 5 mTorr), the RF power is 100 W, and the time is 30 minutes. The film thickness of the iridium oxide thus obtained is approximately 2000 nm according to an evaluation using a fluorescent X-ray apparatus.

Subsequently, leakage current per cathode layer 4 having a diameter of 1.5 mm is measured in the state of applying a voltage of 10 V to anode 1, by using a manual prober and a semiconductor parameter analyzer (4156A manufactured by Agilent Technologies). The obtained leakage current is $4.43 \times 10^{-9}$ A.

In addition, a work function of the iridium oxide is measured by using a photoelectron spectroscopy in air (AC-2 manufactured by RIKEN KEIKI Co., Ltd.). The obtained work function $f_m$ is 5.12 eV.

(Evaluation Sample 2)

A niobium solid electrolytic capacitor according to Evaluation Sample 2 is manufactured in the same way as Evaluation Sample 1 except that a cathode layer is formed by using iridium instead of iridium oxide used in Evaluation Sample 1.

The cathode layer of iridium is formed by using iridium of 99.9% purity as a target under the sputtering conditions in which the total pressure is 1.2 mTorr (Ar pressure), the RF power is 200 W, and the time is 20 minutes. The film thickness of the iridium thus obtained is approximately 400 nm according to an evaluation using a fluorescent X-ray apparatus.

Subsequently, leakage current of the sample according to Evaluation Sample 2 is measured, and the obtained leakage current is $6.44 \times 10^{-8}$ A. In addition, a work function of the iridium is measured, and the obtained work function $f_m$ is 5.01 eV.

(Evaluation Sample 3)

A niobium solid electrolytic capacitor according to Evaluation Sample 3 is manufactured in the same way as Evaluation Sample 1 except that a cathode layer is formed by using platinum instead of iridium oxide used in Evaluation Sample 1.

The cathode layer of platinum is formed by using platinum of 99.9% purity as a target under the sputtering conditions in which the total pressure is 1.2 mTorr (Ar pressure), the RF power is 200 W, and the time is 20 minutes. The film thickness of the platinum thus obtained is approximately 650 nm according to an evaluation using a fluorescent X-ray apparatus.

Subsequently, leakage current of the sample according to Evaluation Sample 3 is measured, and the obtained leakage current is $4.08 \times 10^{-7}$ A. In addition, a work function of the platinum is measured, and the obtained work function $f_m$ is 4.90 eV.

(Evaluation Sample 4)

A niobium solid electrolytic capacitor according to Evaluation Sample 4 is manufactured in the same way as Evaluation Sample 1 except that a cathode layer is formed by using aluminum instead of iridium oxide used in Evaluation Sample 1.

The cathode layer of aluminum is formed by a vapor deposition method using resistance heating, instead of a sputtering method. The film thickness of the aluminum thus obtained is approximately 1,000 nm according to an evaluation using a fluorescent X-ray apparatus.

Subsequently, leakage current of the sample according to Evaluation Sample 4 is measured, and the obtained leakage current is $8.22 \times 10^{-4}$ A. In addition, a work function of the aluminum is measured, and the obtained work function $f_m$ is 4.18 eV.

The anode materials, the cathode layer materials and the measurement results of the above-described evaluation samples are shown below in Table 1.

TABLE 1

| | Anode material | Cathode layer material | Work function $\Phi_m$ [eV] | Barrier height $\Phi_b$ [eV] | Leakage current [A] |
|---|---|---|---|---|---|
| Evaluation sample 1 | Nb | Iridium oxide | 5.12 | 0.65 | $4.43 \times 10^{-9}$ |
| Evaluation sample 2 | Nb | Iridium | 5.01 | 0.54 | $6.44 \times 10^{-8}$ |
| Evaluation sample 3 | Nb | Platinum | 4.90 | 0.43 | $4.08 \times 10^{-7}$ |
| Evaluation sample 4 | Nb | Aluminum | 4.18 | −0.29 | $8.22 \times 10^{-4}$ |

As apparent from Table 1, Evaluation Samples 1 and 2 can reduce leakage current compared with Evaluation Samples 3 and 4. This is because the work function of the cathode layer is not smaller than 5 eV in each of Evaluation Samples 1 and 2. Accordingly, the height $f_b$ of the barrier formed at the interface between the cathode layer and the dielectric layer can be increased, and consequently the leakage current can be reduced.

In the case of using a solid electrolytic capacitor using tantalum for an anode, leakage current is less than in the case of using a solid electrolytic capacitor using niobium for an anode. A result of an examination of the reasons is given below.

A dielectric layer made of tantalum oxide ($Ta_2O_5$) in the solid electrolytic capacitor using tantalum for the anode has a band gap Eg which is larger than a band gap Eg of a dielectric layer made of niobium oxide ($Nb_2O_5$) in the niobium solid electrolytic capacitor. For this reason, the height of a barrier of the dielectric layer formed between the anode and a cathode layer can be larger in the tantalum solid electrolytic capacitor than in the niobium solid electrolytic capacitor. Accordingly, the tantalum solid electrolytic capacitor can reduce leakage current. In addition, the dielectric layer made of niobium oxide has more defects than the dielectric layer made of tantalum oxide does. This further reduces the height of the barrier of the dielectric layer formed between the anode and the cathode layer in the niobium solid electrolytic capacitor.

Furthermore, in the solid electrolytic capacitor using tantalum for the anode, an ionization potential $I_p$ and a band gap Eg of the dielectric layer made of tantalum oxide is 7.80 eV and 4.85 eV, respectively. Therefore, an electron affinity $\chi_s$ is 2.95 eV. Thus, in the tantalum solid electrolytic capacitor, the height $f_b$ of the barrier (the height of the barrier formed at the interface between the cathode layer and the dielectric layer) expressed by the difference between the work function $f_m$ of the cathode layer and the electron affinity $\chi_s$ of the dielectric layer is also large, and hence leakage current is less likely to occur. On the other hand, the electron affinity $\chi_s$ of niobium oxide in the niobium solid electrolytic capacitor is 4.47 eV, which is larger than the electron affinity $\chi_s$ of tantalum oxide, i.e., 2.95 eV. For this reason, the height $f_b$ of the barrier is smaller in the niobium solid electrolytic capacitor.

From the above reasons, it is understood that occurrence of leakage current is more serious in the niobium solid electrolytic capacitor than in the tantalum solid electrolytic capacitor.

By setting the work function $f_m$ of the cathode layer to be 5 eV or larger in the niobium solid electrolytic capacitor using niobium oxide having a high conductivity for the dielectric layer and a metal or an electrically-conductive metal compound for the cathode layer as in the invention, the height $f_b$ of the barrier between the dielectric layer and the cathode layer can be increased, and consequently leakage current can be reduced even in the state of applying a voltage to the anode.

Accordingly, as long as the work function $f_m$ of the cathode layer is 5 eV or larger, the effect of suppressing leakage current can be expected of the niobium solid electrolytic capacitor even when the cathode layer is made of a metal other than iridium oxide and iridium used in Evaluation Samples 1 and 2, or an electrically-conductive metal compound. Examples of the cathode layer having a work function $f_m$ of 5 eV or larger are those made of palladium, rhodium, rhenium, cobalt, nickel, palladium oxide, rhodium oxide, rhenium oxide and the like. Examples of a cathode layer having a work function $f_m$ smaller than 5 eV are those made of gold ($f_m$=4.99 eV), platinum ($f_m$=4.90 eV), aluminum ($f_m$=4.18 eV) and the like. It is found out that, among these, the cathode layer made of aluminum, which does not form the barrier fb, hardly suppresses leakage current.

The work function $f_m$ of the cathode layer is determined according to the difference in energy between the vacuum level and the Fermi level of the metal or the electrically-conductive metal compound. For this reason, although the cathode layers of Evaluation Samples 1 to 4 vary in thickness, such level of variations in thickness among the cathode layers of Evaluation Samples does not affect the work functions $f_m$ of the cathode layers, and does not change the heights $f_b$ of the barriers at the interfaces each between the dielectric layer and the cathode layer.

As described above, the cathode layer having a work function of 5 eV is formed on the dielectric layer in the solid electrolytic capacitor according to each of the embodiments. This configuration can increase the height of the barrier formed at the interface between the cathode layer, which functions as a cathode, and the dielectric layer, and can hence reduce leakage current.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A solid electrolytic capacitor comprising:
    an anode including any one of niobium and a niobium alloy;
    a dielectric layer formed on the anode;
    a cathode layer directly formed on the dielectric layer, the cathode layer having a work function of 5 eV or larger and including an electrically-conductive metal compound having a work function of 5 eV or larger; and
    a cathode lead layer formed on the cathode layer.

2. The solid electrolytic capacitor of claim 1, wherein electrical conductivity of the cathode layer is between 104 S/cm and 106 S/cm both inclusive.

3. The solid electrolytic capacitor of claim 1, wherein the cathode layer includes an electrically-conductive metal oxide having a work function of 5 eV or larger.

4. The solid electrolytic capacitor of claim 3, wherein the metal oxide is any one selected from iridium oxide, palladium oxide, rhodium oxide and rhenium oxide.

5. The solid electrolytic capacitor of claim 1, wherein the cathode layer includes an electrically-conductive metal nitride having a work function of 5 eV or larger.

6. The solid electrolytic capacitor of claim 5, wherein the metal nitride is any one selected from cobalt nitride and nickel nitride.

7. The solid electrolytic capacitor of claim 1, wherein the cathode lead layer is formed to be in direct contact with the cathode layer.

8. A solid electrolytic capacitor comprising:
    an anode including anyone of niobium and a niobium alloy;
    a dielectric layer formed on the anode;
    a cathode layer directly formed on the dielectric layer, the cathode layer including an electrically-conductive metal compound having a work function of 5 eV or larger containing at least iridium oxide; and
    a cathode lead layer formed on the cathode layer.

9. The solid electrolytic capacitor of claim 8, wherein the cathode lead layer is formed directly on the cathode layer.

10. A method of manufacturing a solid electrolytic capacitor, comprising:
    forming an anode including any one of niobium and a niobium alloy;
    forming a dielectric layer by anodization to cover at least a part of the anode with the dielectric layer;
    forming a cathode layer made of any one of a metal and an electrically-conductive metal compound having a work function of 5 eV or larger to contact and cover at least a part of the dielectric layer with the cathode layer, wherein the step of forming the cathode layer comprises:
    soaking the anode on which the dielectric layer is formed, in a plating solution made by dissolving iridium chloride in a phosphoric acid solution; and
    applying a predetermined voltage to the anode and a counter electrode soaked in the plating solution; and
    forming a cathode lead layer to cover at least a part of the cathode layer with the cathode lead layer.

* * * * *